(12) United States Patent
Rimkunas et al.

(10) Patent No.: US 6,591,202 B1
(45) Date of Patent: Jul. 8, 2003

(54) MAGNETIC FIELD MEASURING DEVICE

(75) Inventors: Joseph F. Rimkunas, Massapequa Park, NY (US); William Wahl, Smithtown, NY (US); Gordon Danby, Wading River, NY (US)

(73) Assignee: Fonar Corporation, Melville, NY (US)

( * ) Notice: Subject to any disclaimer, the term of this patent is extended or adjusted under 35 U.S.C. 154(b) by 50 days.

(21) Appl. No.: 09/717,098

(22) Filed: Nov. 22, 2000

(51) Int. Cl.[7] .............................................. G01R 15/00
(52) U.S. Cl. ............................ 702/57; 702/57; 702/74; 702/150; 324/202; 324/205; 324/319; 335/81; 335/220; 335/281
(58) Field of Search .............................. 702/33, 35, 38, 702/57, 64, 66, 71, 74, 85–87, 90, 94, 95, 106, 107, 150, FOR 103–FOR 106, 111; 324/300–302, 318–322, 202, 200, 205, 207.11, 207.12, 207.13, 207.14, 207.15, 207.2, 207.21, 207.22, 225, 228, 246–263, 319; 335/2, 8, 78, 81, 85, 220, 281

(56) References Cited

U.S. PATENT DOCUMENTS 5,488,950 A * 2/1996 Ehnholm .................. 128/653.1
6,211,675 B1 * 4/2001 Ganin et al. ................ 324/318

* cited by examiner

*Primary Examiner*—Marc S. Hoff
*Assistant Examiner*—Elias Desta

(57) ABSTRACT

An apparatus and method that tests an NMR system, including MRI scanners, by taking H-B measurements for the apparatus at any stage during the manufacture thereof, to thereby detect any defects of the NMR system at any point during the manufacture thereof.

38 Claims, 6 Drawing Sheets

CROSS SECTION OF MAGNET WITH H-B APPARATUS

MAGNET CONSTRUCTION
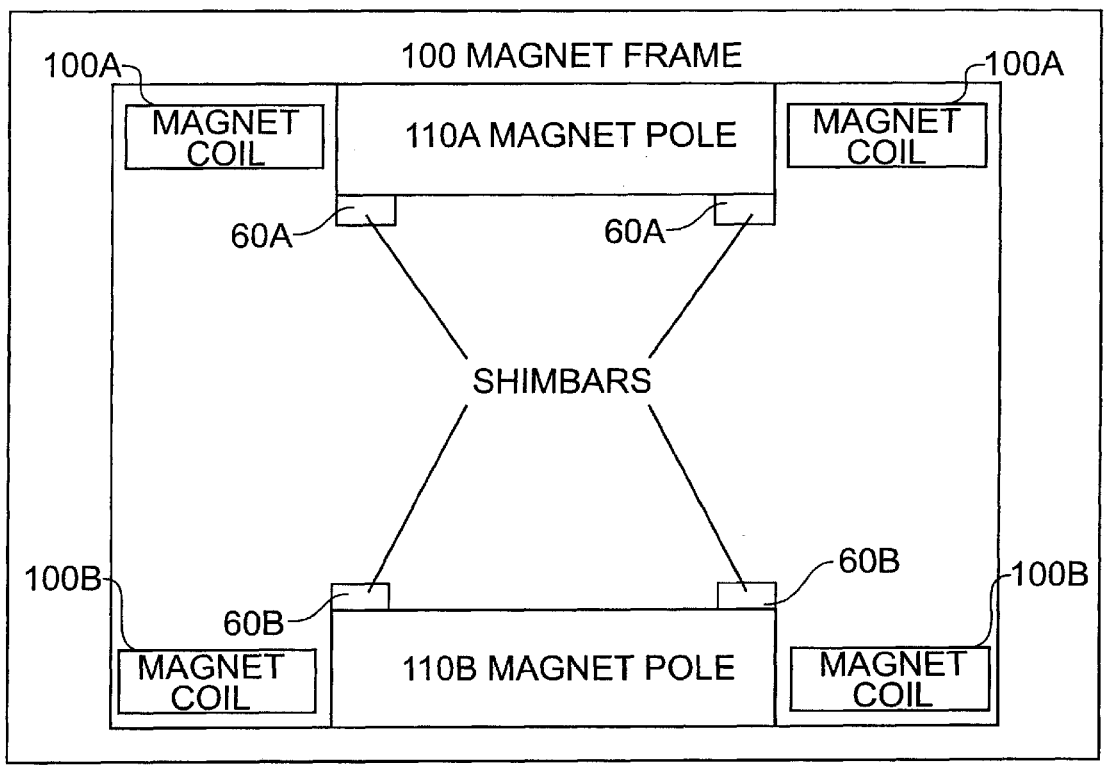
FIG. 2A  CROSSECTION VIEW
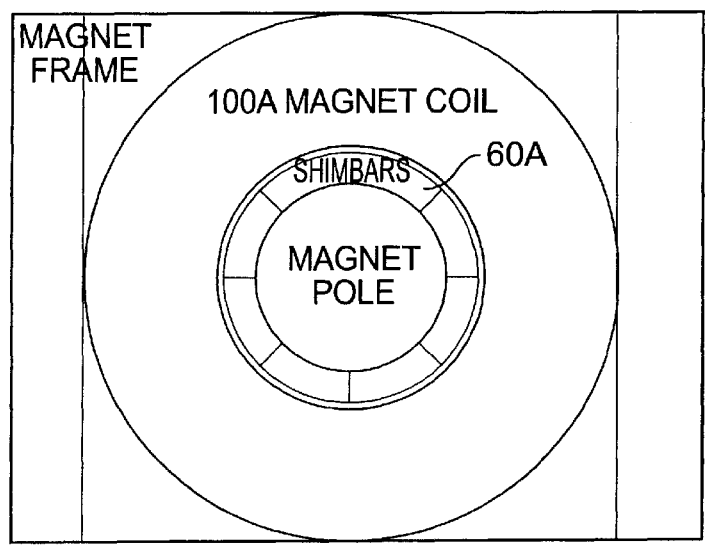
FIG. 2B  TOP VIEW THROUGH CENTER

MAGNETIC FIELD MEASURING DEVICE

FIELD OF THE INVENTION

The present invention relates to the field of nuclear magnetic resonance imaging systems (NMR), including, but not limited to, magnetic resonance imaging (MRI) devices. In particular, the present invention provides an apparatus and method for testing the dynamic response of such magnetic devices to a changing magnetic field.

BACKGROUND OF THE INVENTION

Magnetic resonance imaging techniques generally employ pulsed magnetic field gradients to spatially encode nuclear magnetic resonance (NMR) signals from various portions of an anatomical or physical region of interest. The pulsed magnetic field gradients, together with radio frequency excitation of the nuclear spins, and acquisition of signal information are commonly referred to as a pulse sequence. Thus, NMR systems including MRI scanners, for instance, employ magnetic pulse sequences to create a visual image of a subject. In these sequences, magnetic fields are turned on and off, or otherwise changed at very rapid rates, to precisely calculated levels, all at precisely timed intervals.

However, the changing of magnetic fields produces inductive effects, including eddy currents. These inductive effects create their own opposing magnetic fields and thus delay and/or distort the desired magnetic fields required for precise imaging. The level of delay and distortion of the desired magnetic fields is called the dynamic response. Thus, a degraded dynamic response, that is a high level of delay and/or distortion, results in degraded performance by a particular NMR system. Such degradation in the dynamic response of the particular NMR system can be brought about by, for example, manufacturing and installation defects including continuous, closed, electrically conductive paths.

In the field of NMR systems, the dynamic response of the particular NMR systems, including, but not limited to MRI scanners, is detected and measured using H-B testing, which is a method of comparing the dynamic response of two different magnetic fields. The H-field is a magnetic field of a coil in free space, and the B-field is the magnetic field of another coil or set of coils that is/are not in free space, or in the present case within the gap of an iron frame magnet. The H-field follows along with the input current function, while the B-field is distorted due to eddy currents and hysteresis effects, when driven by the same input current function. Two pick-up coils that are wired together in series opposition, with one of the pick-up coils being placed in the H-field and the other pick-up coil being placed in the B-field, will give the H-B signal, which is the difference between the signal from the pick-up coil in the H-field and the signal from the pick-up coil in the B-field. In order to obtain H-B measurements, a testing apparatus requires an H-field producing coil that can handle substantial electrical currents, an H-field coil support that holds the coil away from any conductive or magnetic objects, H- and B- field pick-up coils that convert magnetic field changes into electrical impulses, an integrator that reconstructs the electrical impulses into a form that represents the magnetic field, an oscilloscope that facilitates signal capture and measurement, and a programmable current source that supplies the electric current to thereby produce both the H- and the B- fields.

Presently, H-B testing are performed only for particular components of an NMR system, and the testing apparatus has been adapted to fit the configuration of the particular system. Thus, excitation coils are required to be bolted or otherwise affixed to the NMR system component, and the center and rotation thereof must be aligned using plumb bobs, levels and rulers. The varying configurations of the NMR systems results in uncontrolled test data which is not appropriate for comparison with other NMR system configurations.

Furthermore, according to current methods for H-B testing of NMR system components as described above, when a next level of assembly of the NMR system is reached, the H-B test requires that the excitation coils that were bolted or otherwise affixed to a component in the previous stage of assembly and testing must be removed and mounted once again at a different distance from the poles. Such testing method is vulnerable to inconsistent H-B measurements, often resulting from the test method itself and the alignment of the testing apparatus.

Such inconsistencies in the alignment of the testing device relative to the poles of the MRI scanning device can actually result in dipoles, that is the effect being measured. Dipoles, or dynamic dipoles, occur when the magnetic fields from two sources that are designed to cancel each other are different as a function of time while they are changing. If the two excitation coils are misaligned, they may induce a different set of eddy currents in each pole and therefore there will be a net field in regions where the net field should be zero (0) until the eddy currents dissipate. Dynamic dipoles occur as the result of defects or other differences in the poles.

SUMMARY OF THE INVENTION

Therefore, an object of the present invention is to provide an apparatus and method that tests an NMR system, including MRI scanners, by taking H-B measurements for the apparatus at any stage during the manufacture thereof, to thereby detect any defects of the NMR system at any point during the manufacture thereof. Specifically, after each successive step in the assembly of the NMR system, the present invention provides verification that the immediately preceding assembly step did not affect the dipole and speed characteristics of the NMR system without incurring additional assembly or significant amounts of time.

Thus, another object of the present invention is to provide an apparatus and method that quantifies the dipole and speed characteristics of any particular set-up of an NMR system.

As set forth above, the present invention is directed to the field of nuclear magnetic resonance imaging systems (NMR). However, in order to provide a clear and practical understanding of the invention, the following summary and disclosure of the invention will be directed to a magnetic resonance imaging (MRI) scanning apparatus, although the present invention is clearly not so limited. That is, the present invention has application in all system embodiments within the field of nuclear magnetic resonance imaging (NMRI), and the following description is by way of example only.

Accordingly, to accomplish the objects described above and other objects as well, the present invention provides a self-contained apparatus, having parallel plates in the configuration of a double sided table, that can be inserted into a gap of the MRI scanner, or any other magnetic device, as the scanner is being assembled or even upon completion of the scanner. The self-contained apparatus that provides dipole and magnetic gap speed measurement in an MRI scanner or other magnetic device includes excitation coils, as described above, that are attached to each of the parallel plates.

However, to overcome at least the deficiencies described above associated with known H-B testing methods, the self-contained apparatus of the present invention includes a controlling mechanism that controls the distance between the fixed excitation coil and the polecap by providing consistent spacing between the excitation coils and the poles for every level of manufacture of the MRI scanner. To that end, the present invention further includes precision machined excitation coil mounts and a precision machined pin-centering mechanism that maintain upper and lower excitation coils in coaxial alignment with the poles; vertical height adjustment mechanisms that enable vertical alignment and planar leveling of the excitation coils relative to the poles of the MRI scanner by keeping the excitation coils a fixed distance apart from each other, keeping the mid-point of the vertical height adjustment mechanism coincident with the midpoint of the magnetic gap; and a pick-up coil holder/positioner mechanism and grid that enable quick and accurate positioning of the pick-up coils relative to the MRI scanner/magnetic device poles. The present invention is a self-contained apparatus that, because it may be preassembled in one-piece, may be quickly and efficiently inserted into the MRI scanner or other magnetic device at any stage of assembly thereof for testing.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. The following represents brief descriptions of the drawings, wherein:

FIG. 2A is a cross-section of an example of a magnet into which a magnetic field measuring device according to the present invention is placed;

FIG. 2B is an overhead view through a horizontal cross-section of an example magnet shown in FIG. 2A;

DETAILED DESCRIPTION OF THE PREFERRED EMBODIMENT

Figure 1:
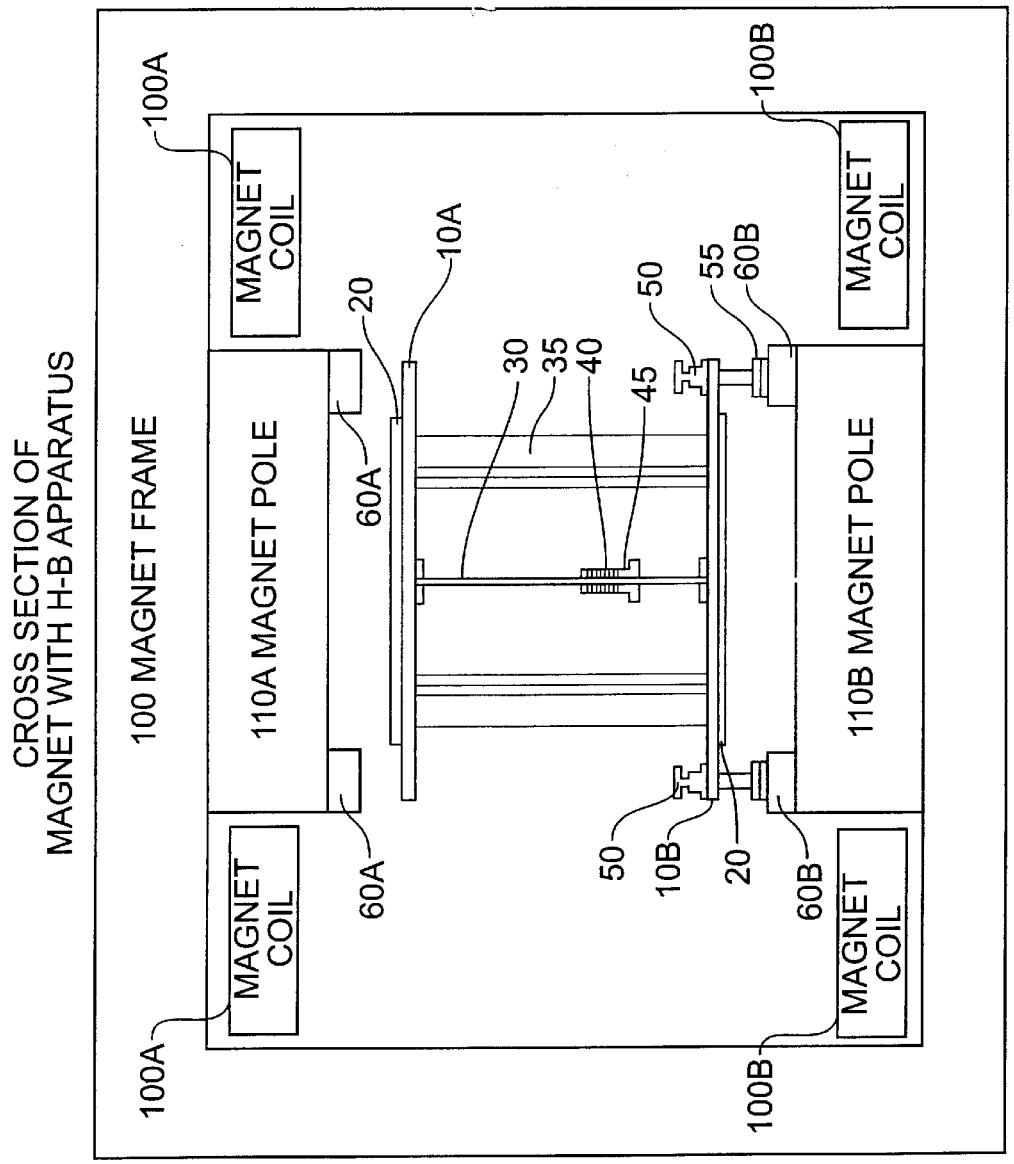
FIG. 1 is a cross-section of an example of a magnetic field measuring device according to the present invention, disposed in a magnet.

As set forth above, a better understanding of the present invention will become apparent from the following detailed description of example embodiments and the claims when read in connection with the accompanying drawings, all forming a part of the disclosure of this invention. However, before beginning a detailed description of the invention, it should be noted that, when appropriate, the same reference numerals and characters may be used to designate identical, corresponding or similar components in differing figure drawings. Further, in the detailed description to follow, example embodiments and values may be given, although the present invention is not limited thereto. While the foregoing and following written disclosure focuses on disclosing example embodiments of this invention, it should be clearly understood that the same is by way of illustration and example only and the invention is not limited thereto. The spirit and scope of the present invention are limited only by the terms of the appended claims.

A cross-sectional view of an example embodiment of the dynamic response measuring device is shown in a sample magnet in FIG. 1. A cross-sectional view of the sample magnet is shown in FIG. 2A, with a top view thereof provided in FIG. 2B.

In the example embodiment of FIG. 1, the self-contained dynamic response measuring device includes parallel plates 10 in a "double-sided table" configuration, connected by fixture uprights 35 which are made of, for example, Poly Vinyl Chloride (PVC). The post 30, which is made of, for example, nylon, serves as an axis upon which a spool 45 is mounted, with a pick-up coil 40 being wound around the spool 45. The post 30, which can be moved laterally relative to the axial center of the poles 110A and 110B for testing purposes that are explained further below, and fixture uprights 35 are equal in length to each other, and therefore enable parallel plates 10 to be equi-distant, and therefore parallel, to each other.

Figure 4A:
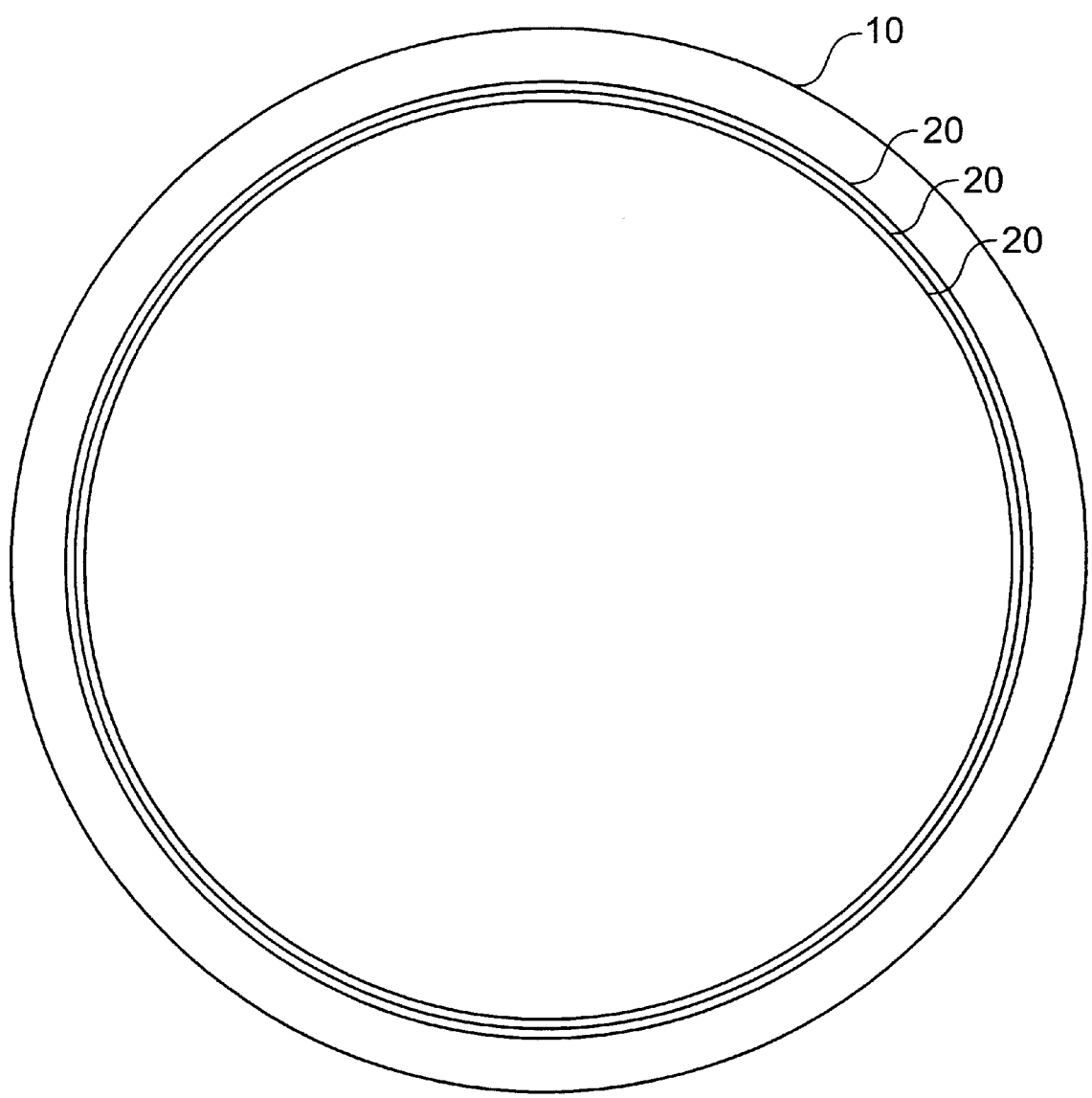
FIG. 4A is a top view of a parallel plate according to an example of the present invention.

Both of parallel plates 10 include "Y" -type excitation coils disposed thereon, as shown in FIG. 4A, and the excitation coils 20 are exposed, facing away from the fixture uprights 35 and towards the magnet poles 110. The excitation coils produce a Y component of a magnetic field that varies linearly in the "Y"-direction when energized in pairs that are parallel, coaxial, and powered in opposite directions.

Figure 4B:
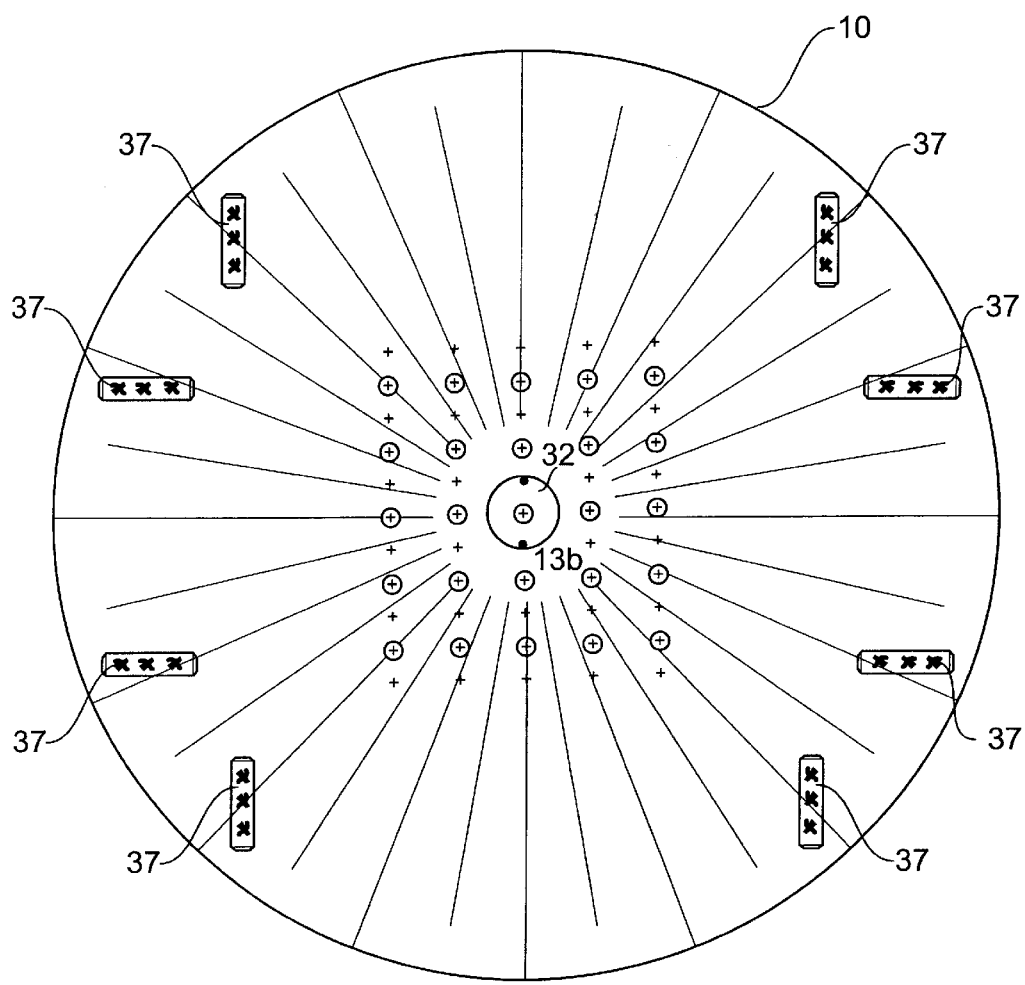
FIG. 4B is a bottom view of the parallel plate according to an example of the present invention.

PVC fixture uprights 35 are attached to the bottom of parallel plates 10 using, for example, screws. That is, as shown in FIG. 4B, the bottom of parallel plates 10 include recesses 37 having multiple screw holes therein for receiving and securely attaching the uprights 35 thereto. Furthermore, the post 30 is attached to the parallel plates 10 using center mounting post 32. As shown in mounting post 32, a central hole is denoted by $\oplus$, and the exterior screw holes are denoted by +. Thus, as shown further in FIG. 4B, mounting post 32 can be configured laterally along the bottom portions of the parallel plates 10, so that the post 30, can be moved laterally for testing purposes that will be described further below. FIG. 2A shows a cross-sectional view of an example magnet in which the dynamic response measuring device of the present invention is inserted, in accordance with the example of FIG. 1. The magnet corresponds to, for example, a magnetic device such as a magnetic resonance imaging (MRI) device. In the magnet, magnet frame 100 includes top and bottom magnet coils 110A and 100B, respectively. The top and bottom magnet poles 111A and 110B, respectively, have shimbars 60A and 60B, respectively, disposed on outer portions thereof, and a top view through an horizontal cross-section of the magnet frame is shown in FIG. 2B.

Figure 3A:
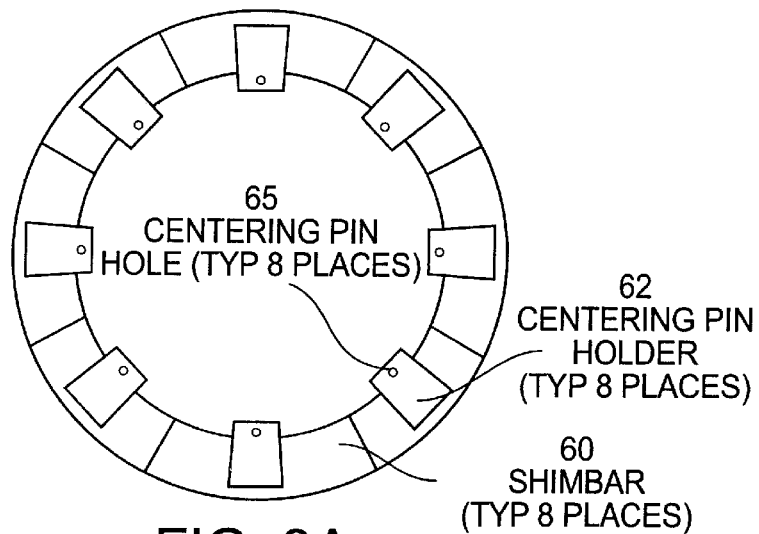
FIG. 3A is an overhead view of an example of a shimbar on the example magnet of FIGS. 2A and 2B.
Figure 3B:
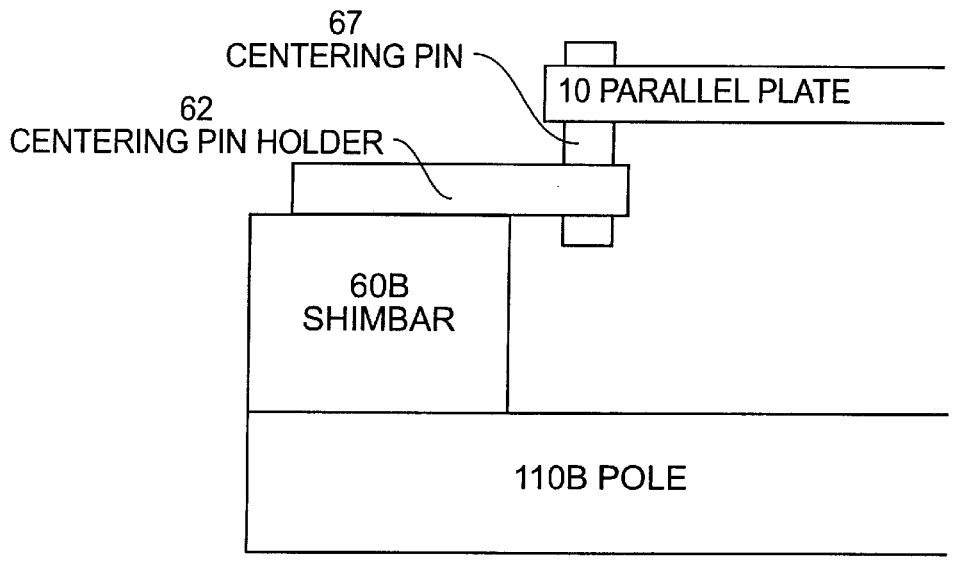
FIG. 3B is a cross-sectional view of the example shimbar of FIG. 3A.

FIG. 3A shows a top view of the shimbars 60, which include, for example, eight centering pin holders 62, with centering pin holes 65. The centering pin holders 65 may be mounted every 45 degrees to a top portion of the shimbars 60B. The dynamic response measuring device is inserted into the gap of the maget frame 100 with excitation coil leads towards the rear and the vertical height adjusters 50 on the lower side of the apparatus. Horizontal centering of the dynamic response measuring device within the gap of the magnet 100 is first performed subjectively, and a final, more precise, horizontal centering is performed by inserting centering pins 67 through corresponding centering pin holes in both the bottom parallel plate 10 and centering pin holders 62 that are mounted to the shimbar 60B. Thus, for the dynamic response measuring device to be properly disposed within the magnet frame 100 as shown in FIG. 1, the device is attached to the apparatus as shown in FIG. 3B, such that the excitation coils 20 on both of parallel plates 10 are in coaxial alignment with the poles 110A and 110B. In particular, on a bottom portion of the magnet frame, shimbar 60B is disposed on pole 110B, and a centering pin 67 is inserted in each centering pin hole 65 of one of the centering pin holders 62 and corresponding holes on an outer portion of the bottom parallel plate 10. FIG. 4A shows an outer portion of the parallel plates 10, the outer portion of the parallel plates facing the magnet poles 110A and 110B.

As shown in FIG. 1, vertical height adjusters 50 are provided on a bottom portion of the dynamic response measuring device. Height adjusters 50 include a knurled knob which 1s attached to a threaded rod, and are assembled by screwing the knob assembly onto a vertical height adjuster base 55, inserting an adjustment piston into the base 55 from the other end and screwing the vertical height adjuster down onto the bottom parallel plate 10. The height adjustment is made by turning the knurled knob clockwise or counter-clockwise, respectively, to go up or down. Thus, the fixture uprights 35 keep the parallel plates 10, and therefore the excitation coils 20, a fixed distance apart from each other. Furthermore, the height adjusters 50 enable vertical alignment and planar leveling of the excitation coils 20 relative to the poles 110, further keeping the midpoint of the post 30 and fixture uprights 35 coincident with the midpoint of the magnetic gap, which is crucial for optimum testing results.

By way of example only, an embodiment of dynamic response measuring device according to the present invention will be further described hereafter by way of example using specific values and dimensions. However, as set forth above, such values and dimensions are merely exemplary and the present invention is in no way limited thereto.

Figure 5:
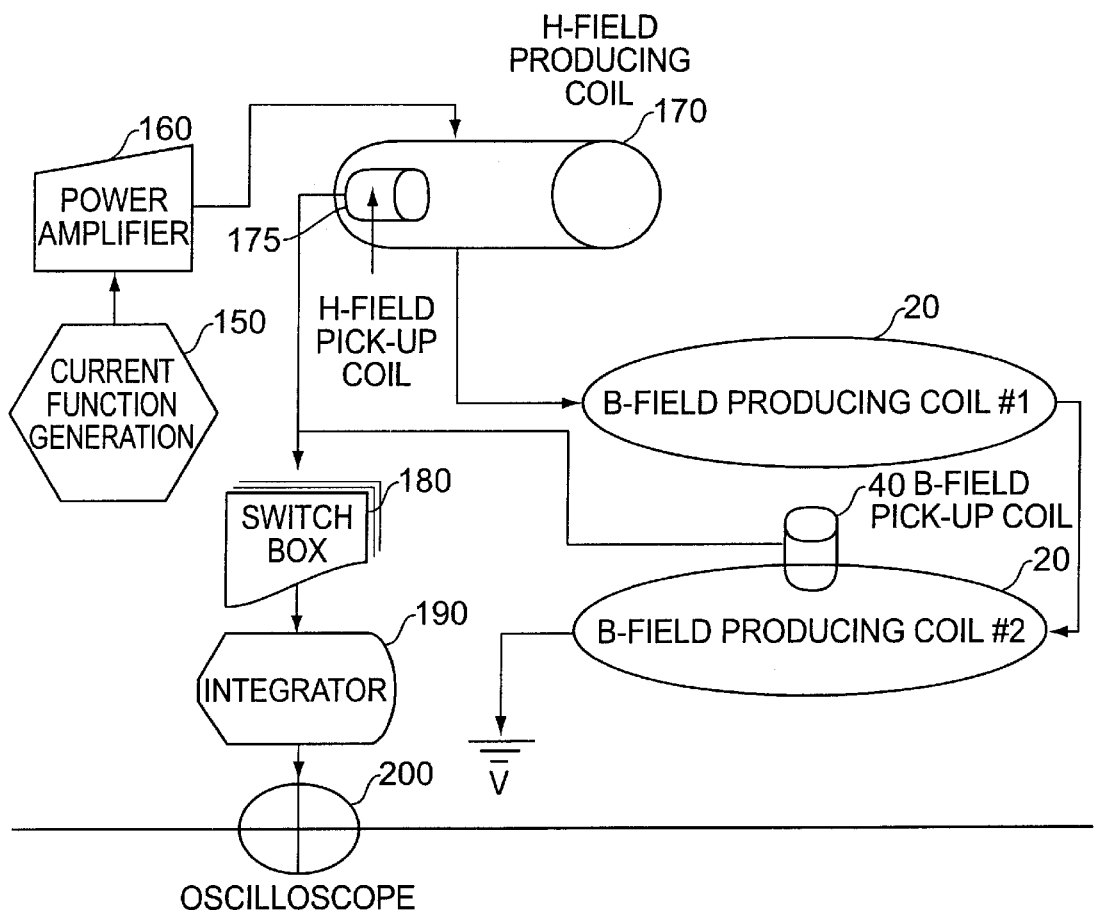
FIG. 5 shows an example of an H-B signal circuit utilized in correspondence with an example embodiment of the present invention.

In accordance with known H-B measurement techniques, as shown in FIG. 5, the dynamic response measuring device of the present application can operate in conjunction with H-field excitation coil 170, which is, for example, a 43.75" long, 4" ID PVC pipe wrapped with 0.170" square, copper magnet wire according to the equation:

$$d=A(2\pi n+\theta)^2+B(2\pi n+\theta); \quad (1)$$

wherein n is the number of turns, θ=angle in radians and:

$$A=(L-d_1T)/4\pi^2T(T-1); \quad (2)$$

$$B=(d_1-4\pi^2A)/2\pi; \quad (3)$$

wherein L=length of coil=24", $d_1$=spacing between $1^{st}$ and $2^{nd}$ turns at zero degrees =0.5", and T=total number of turns=14. This H-field excitation coil 170 rests, external to the dynamic response measuring device, with its axis horizontally oriented on a stand constructed of ¾" ID PVC pipe, at a height off of the ground of 42.25" and away from electrically conductive or magnetic objects. Along with this H-field producing excitation coil 170 is H-field pick-up coil 175. H-field pick-up coil 175 includes, for example, 35 turns of AWG-18 copper magnet wire wrapped evenly over a 3" span on a 3.5" length of a 3.5" OD PVC pipe. ¼" spacers along the length of the coil 175 at 90 degree intervals allows the coil 175 to be inserted coaxially into the H-field producing coil 170. A length of PVC bar stock, affixed to the pick-up coil is used to move the pick-up coil 175 inside of the H-field producing coil 170.

Also shown in FIG. 5 is switchbox 180 which is used to switch between the H-field pick-up coil 175, the B-field pick-up coil 40 and another coil as desired. It is also used to connect the H-field pick-up coil 175 to the B-field pick-up coil 40 in series opposition.

Two other known pieces of equipment that are needed are an integrator 190 and an oscilloscope 200. The integrator 190 converts the output of pick-up coils 175 and 40, respectively, into a signal with a form similar to a current wave form through the excitation coils 20. The oscilloscope 200 is used to observe and measure results. A wavefunction source 150 and an amplifier 160 are utilized to supply a current through the H-field excitation coil 170 and B-field excitation coil 20.

As an example, the test subject magnet's computer system, in this case the MRI apparatus, is used to supply the wavefunction and one of the gradient amplifiers of the MRI apparatus is further used to supply the current. A dedicated computer "(i.e. wavefunction source)" and amplifier is contemplated for a truly independent measurement system.

To utilize the dynamic response measuring device according to the present invention, showing in FIGS. 1 and 5, to measure the dynamic response of a magnetic device to a changing magnetic field of, for example, an MRI apparatus, a wire is connected to the positive output terminal of a gradient amplifier and it leads to the excitation coil 20 on one of the parallel plates 10. The output of this coil 20 is wired to the input of the other excitation coil 20 on the second of the parallel plates 10, and the output of the second excitation coil 20 is wired to the input of the H-field producing coil 170. To complete the power circuit, the output of the H-field producing coil 170 is wired to the negative output terminal of the gradient amplifier 160.

The signal circuit begins at the oscilloscope 200. The oscilloscope trigger input is wired to the "trigger pulse" output on the gradient amplifier. A channel of the oscilloscope 200 is wired to the output of the integrator 190, and the input of the integrator 190 is wired to the output of the switch box 180. An input on the switch box 180 is wired to the B-field pick-up coil 40 in the dynamic response measuring device. A second input on the switch box 180 is wired to the H-field pick-up coil 175 to complete the circuit.

Two types of tests are typically taken. One test measures the dynamic dipole and the other, the H-B test, measures certain characteristics of the MRI device. Both tests use a current waveform which is a type of squarewave that has rise and fall functions that are cosine functions. The rise or fall may occur in 500 µs and the plateau duration is about 20 µs. For the dipole test the H-field pick-up coil is not used and the B-field pick-up coil 40 must be at the center of the gap or (0,0,0) in Cartesian coordinates. The switch box 180 may be set so that the output is the signal from the B-field pick-up coil only. The squarewave may be pulsed and the oscilloscope 200 may be set to display one wavelength. The usual scope timebase setting is 5 ms/box. Since the post 30 with the pick-up coil 40 thereon is already in the center position, the B-field pick-up coil 40 is already at (0,Y,0). The post 30 is then moved laterally, or rotated, as referred to previously, to bring the pick-up coil 40 to coordinates (0,0,0). When the pick-up coil 40 is at (0,0,0), the trace may show a linear baseline with two, opposite polarity blips. Dividing the peak to peak amplitude of this trace by two may result in the average absolute dipole peak height, which is a measure of the strength of the dynamic dipole. The relative dipole amplitude, which is useful for comparisons, may be determined using one of the measurements from the speed characteristics measurements.

There are four speed characteristics that may be measured, namely: 95% delay time, 63% delay time, average peak percentage of H-B and Δt to 50%. The delay time measurements may tell how much time passes between the time that the H-field reaches the given percentage of its peak and the time that the B-field reaches the given percentage of its peak. The lower the delay time is, the fewer eddy currents there are and the-faster the set-up may be. Like the dipole trace, the H-B trace appears as two blips of opposite polarity on a linear baseline. Dividing the peak to peak amplitude of this H-B trace in half may give the average absolute H-B amplitude. Dividing further by the amplitude of either H or B and multiplying by 100 may give the average peak percentage of H-B. This number is indicative of the amplitude distortion of the B-field and may also be related to the quantity of eddy currents produced by the pulsing field. ΔT to 50% is a measurement made on one of the blips of the H-B trace, and it is the time it takes for the H-B blip to start and reach 50% of its amplitude after going past the peak. This number gives an indication of the time eddy currents may require to die off. The data acquisition procedures for these measurements follows:

the B field pick-up coil 40 is positioned 3"from (0,0,0) in the direction of the type of excitation coil being used;

the squarewave is pulsed and the oscilloscope 200 is set to display one wave;

the usual scope timebase setting is 5 ms/box;

the switch box 180 may be set to output the result of the H-field pick-up coil 175 in series opposition with the B-field pick-up coil 40;

the H-field pick-up coil 175 may be moved inside the H-field producing coil 170 until the baseline of the H-B trace on the oscilloscope 200 is linear;

the H-B trace may be averaged by the oscilloscope 200 and stored in a first memory in the oscilloscope 200;

the switch box 180 may be set to output only the signal from the B-field pick-up coil 40;

the B field trace may be averaged by the oscilloscope 200 and stored in a second memory of the oscilloscope 200;

the switch box 180 may be set to output only the signal from the H-field pick-up coil 175;

the H-field trace may be averaged by the oscilloscope 200 and left on the screen;

a measurement may be made of the peak-to-peak amplitude of the H-field trace;

a measurement may be made of the peak to peak amplitude of the H-B trace and may be divided in half;

the divided H-B amplitude measurement may be divided by the H-field amplitude and multiplied by 100 to yield the average peak percentage;

a measurement may be made of the amplitude of one of the blips on the H-B trace and divided by 2;

a time measurement may be made starting from the beginning of the blip to the point over the peak where the voltage difference is equal to the number calculated in the previous step. This measurement is the ΔT to 50%;

a measurement may be made of the peak-to-peak amplitude of the H-field trace and multiplied by 0.632;

a measurement may be made of the time from the start of the rise of the H-field trace to the point where the amplitude is equal to the number calculated in the previous step. This is the 63% rise time of the H-field;

a measurement may be made of the peak-to-peak amplitude of the B-field trace in the second memory of the oscilloscope 200 and multiplied by 0.632;

a measurement may be made of the time from the start of the rise of the B-field trace to the point where the amplitude is equal to the number calculated in the previous step. This is the 63% rise time of the B-field;

the difference of the 63% rise time of the H-field and the 63% rise time of the B-field is the 63% delay time;

a measurement may be made of the peak-to-peak amplitude of the H-field trace and multiplied by 0.95;

a measurement may be made of the time from the start of the rise of the H-field trace to the point where the amplitude is equal to the number calculated in the previous step. This is the 95% rise time of the H-field;

a measurement may be made of the peak to peak amplitude of the B-field trace in the second memory of the oscilloscope 200 and multiplied by 0.95;

a measurement may be made of the time from the start of the rise of the B-field trace to the point where the amplitude is equal to the number calculated in the previous step. This is the 95% rise time of the B-field;

the difference of the 95% rise time of the H-field and the 95% rise time of the B-field is the 95% delay time;

the relative dynamic dipole may be calculated by dividing the average absolute dipole peak height by the peak-to-peak amplitude of the H-field trace.

To obtain a complete set of data, the dynamic response measuring device should be removed from the magnet, reassembled using a set of "X" type excitation coils, reinserted and have all tests repeated. Finally, the procedure should be repeated once again using the "Z" type of excitation coils. The "X" type excitation coils include four identical coils that are arranged in such a manner that two coils are adjacent to each other on each of the parallel plates 10, and they produce a "Y" component of a magnetic field that varies linearly in the "X" direction when powered in such a manner that adjacent coils are powered with opposing polarities and coaxial coils are powered with the same polarity. The "Z" type excitation coils are the same as the "X" type excitation coils, except that the "Z" type excitation coils are angularly offset as a unit in the magnet by 90 degrees.

This concludes the description of the example embodiments. Although the present invention has been described with reference to illustrative embodiments thereof, it should be understood that numerous other modifications and embodiments can be devised by those skilled in the art that will fall within the scope and spirit of the principals of the invention. More particularly, reasonable variations and modifications are possible in the component parts and/or arrangements of the subject combination arrangement within the scope of the foregoing disclosure, the drawings and the appended claims without department from the spirit of the invention. In addition to variations and modifications in the component parts and/or arrangements, alternative uses will also be apparent to those skilled in the art.

We claim:

1. A method of measuring dynamic responses in a magnetic device, adjustably positioning plural excitation coils in a gap of said magnetic device such that each said excitation coil is disposed at a selectable, equal distance from a respective pole of said magnetic device;

conducting a current through each said excitation coil to generate changing magnetic fields corresponding to the poles of said magnetic device;

converting a difference between a distorted changing magnetic field and an undistorted changing magnetic field for the respective poles of said magnetic device into first electrical impulses;

converting a difference between two distorted changing magnetic fields for the respective poles of said magnetic device into second electrical impulses; and detecting and measuring said first and second electrical impulses.

2. The method according to claim 1, wherein adjustably positioning plural excitation coils in the gap of said magnetic device includes adjusting a structure that supports said excitation coils in a direction perpendicular to pole faces of said magnetic device.

3. The method according to claim 1, wherein conducting the current through each said excitation coil includes conducting an equal current through each said excitation coil simultaneously.

4. The method according to claim 1, wherein said method is performed during the assembly of said magnetic device.

5. The method according to claim 2, wherein said structure includes plural plates on which respective ones of said excitation coils are mounted, and a plurality of spacers connected to the plates and maintaining a parallel spatial relationship between the plates.

6. The according to claim 5, wherein said excitation coils include coils that are disposed in series opposition to each other in said structure.

7. The method according to claim 5, wherein said excitation coils are disposed in series opposition to each other in said structure.

8. The method according to claim 5, wherein said plates are disposed parallel to the poles of said magnetic device.

9. The method according to claim 5, wherein the composition of said plates includes poly vinyl chloride.

10. The method according to claim 5, wherein said excitation coils are attached to said plates by nylon screws.

11. The method according to claim 5, wherein said excitation coils include copper magnetic wire.

12. The method according to claim 5, wherein said excitation coils are disposed in coaxial alignment with the poles of said magnetic device.

13. The method according to claim 12, wherein converting a difference between a distorted changing magnetic field and an undistorted changing magnetic field for the respective poles of said magnetic device into first electrical impulses is performed by a first pick-up coil that is adjustably mounted to a post that extends between and perpendicular to said parallel plates, and a second pick-up coil that is disposed external to said structure in another magnetic field producing coil.

14. The method according to claim 13, wherein said another magnetic field producing coil is disposed axially perpendicular to the axial direction of said excitation coils supported by said structure.

15. The method according to claim 13, wherein said another magnetic field producing coil is disposed in virtually free space.

16. The method according to claim 13, wherein said first pick-up coil is disposed at an equal distance from each of said parallel plates.

17. The method according to claim 16, wherein said first pick-up coil is wound on a spool that is mounted to reciprocate on said post.

18. The method according to claim 17, wherein said first pick-up coil is electrically connected to an oscilloscope.

19. An apparatus for measuring dynamic responses in a magnetic device, comprising:

plural excitation coils that are adjustably positioned in a gap of a magnetic device such that each said excitation coil is disposed at an equal distance from a respective pole of said magnetic device, wherein said excitation coils each conduct a varying current to generate changing magnetic fields corresponding to the poles of said magnetic device; and a pick-up coil disposed between the excitation coils.

20. The apparatus according to claim 19, further comprising a structure that supports said excitation coils, said structure including positional adjusters by which a position of said structure with respect to the poles of said magnetic device can be adjusted.

21. The apparatus according to claim 19, wherein the varying current conducted through each said excitation coil is equal and is conducted simultaneously through said plural excitation coils.

22. The apparatus according to claim 19, wherein said magnetic device is a partially assembled magnetic device.

23. The apparatus according to claim 20, wherein said structure includes plural plates on which respective ones of said excitation coils are mounted, and a plurality of spacers connected to said plates and maintaining a parallel spatial relationship between the plates.

24. The apparatus according to claim 23, wherein said excitation coils include coils that are disposed in series opposition to each other in said structure.

25. The apparatus according to claim 23, wherein said excitation coils are disposed in series opposition to each other in said structure.

26. The apparatus according to claim 25, wherein said plates are disposed parallel to the poles of said magnetic device.

27. The apparatus according to claim 25, wherein the composition of said plates includes poly vinyl chloride.

28. The apparatus according to claim 25, wherein said excitation coils are attached to said plates by nylon screws.

29. The apparatus according to claim 25, wherein said excitation coils include copper magnetic wire.

30. The apparatus according to claim 25, wherein said excitation coils are disposed in coaxial alignment with the poles of said magnetic device.

31. The apparatus according to claim 30, wherein said structure includes a post disposed between and perpendicular to said parallel plates, on which said pick-up coil is adjustably mounted.

32. The apparatus according to claim 31, wherein said pick-up coil is disposed at an equal distance from each of said parallel plates.

33. The apparatus according to claim 32, wherein said pick-up coil is wound on a spool that is mounted to reciprocate on said post.

34. The apparatus according to claim 33, wherein the pick-up coil is a first pick-up coil, and further including a second pick-up coil having polarities that are opposite the polarities of said first pick-up coil and disposed external to said structure, wherein said first pick-up coil and said second pick-up coil convert a difference between a distorted changing magnetic field and an undistorted changing magnetic field for the respective poles of said magnetic device into first electrical impulses, and wherein said first pick-up coil and said second pick-up coil convert a difference between two distorted changing magnetic fields for the respective poles of said magnetic device into second electrical impulses.

35. The apparatus according to claim 34, wherein said first pick-up coil and said second pick-up coil are electrically connected to an oscilloscope.

36. The method according to claim 13, wherein said post is transversely adjustable in such a manner as to remain parallel to an axial direction of said parallel plates.

37. The apparatus according to claim 31, wherein said post is transversely adjustable in such a manner as to remain parallel to an axial direction of said parallel plates.

38. The apparatus according to claim 33, wherein said pick-up coil converts a difference between two distorted changing magnetic fields for the respective poles of said magnetic device into electrical impulses.

\* \* \* \* \*